(12) United States Patent
Katoh et al.

(10) Patent No.: US 6,455,207 B1
(45) Date of Patent: Sep. 24, 2002

(54) COLOR FILTER AND A METHOD FOR PRODUCING A COLOR FILTER

(75) Inventors: Tsuyoshi Katoh; Tomonari Ogata, both of Kanagawa (JP)

(73) Assignee: Showa Denko Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/514,329

(22) Filed: Feb. 28, 2000

Related U.S. Application Data
(60) Provisional application No. 60/132,449, filed on May 4, 1999.

(30) Foreign Application Priority Data

Feb. 26, 1999 (JP) ............................................. 11-049742

(51) Int. Cl.$^7$ .......................... G02B 5/20; G02F 1/1335
(52) U.S. Cl. .......................................................... 430/7
(58) Field of Search ...................... 430/7, 281.1, 270.1

(56) References Cited

U.S. PATENT DOCUMENTS

| | | | | |
|---|---|---|---|---|
| 4,917,977 A | * | 4/1990 | Smothers ........................ | 430/1 |
| 5,176,984 A | * | 1/1993 | Hipps, Sr. et al. ....... | 430/281.1 |
| 5,622,794 A | | 4/1997 | Sato et al. | |
| 6,207,726 B1 | * | 3/2001 | Ohtani et al. .................. | 522/26 |

FOREIGN PATENT DOCUMENTS

| | | |
|---|---|---|
| DE | 44 43 780 | 6/1995 |
| EP | 879 829 | 11/1998 |
| EP | 889 362 | 1/1999 |
| EP | 900 800 | 3/1999 |
| GB | 2 307 474 | 5/1997 |

OTHER PUBLICATIONS

Li et al., "4–(4'–dimethylaminostrly)benzophenone/diphenyliodonium salt—a new kind of electron transfer photosensitization system for radical photopolymerization" Chem. Ab. + Indexes, US American Chem. Society, vol. 121, No. 18, Oct. 1994.

\* cited by examiner

*Primary Examiner*—John A. McPherson
(74) *Attorney, Agent, or Firm*—Sughrue Mion, PLLC

(57) ABSTRACT

A photopolymerization initiator for producing a color filter including a sensitizer (A) which absorbs light having a wavelength of 300 to 500 nm, an organic boron complex (B), and a thiol-group-containing compound (C); a photosensitive coloring composition including a transparent polymer (D) which is soluble to a solvent or an aqueous alkaline solution, a compound having ethylenic unsaturated bonds (E), a pigment (F), and the photopolymerization initiator; a color filter having a pixel formed by use of the coloring composition on a transparent substrate; and a method for producing the color filter.

8 Claims, No Drawings

COLOR FILTER AND A METHOD FOR PRODUCING A COLOR FILTER

CROSS REFERENCE TO RELATED APPLICATIONS

This application is an application filed under 35 U.S.C. §111(a) claiming benefit pursuant to 35 U.S.C. §119(e)(i) of the filing date of Provisional Application No. 60/132,449 filed May 4, 1999 pursuant to 35 U.S.C. §111(b).

FIELD OF THE INVENTION

The present invention relates to a high-sensitivity photopolymerization initiator for producing a color filter; to a high-quality photosensitive coloring composition for producing a color filter, which can be developed with a solvent or an aqueous alkaline solution after irradiation with UV light; to a color filter which is used in devices such as a solid state pick-up device and a liquid crystal display device; and to a method for producing the color filter.

BACKGROUND OF THE INVENTION

In recent years, demand has arisen for a color filter used in a device such as a liquid crystal display device, where the filter is thin and defect-free; has properties such as heat and light resistance; and has optical properties such as high transparency and high contrast in accordance with the trend toward reducing the thickness and increasing the width of the device. In addition, increase of the yield of a production step and reduction in the number of production steps are more and more required, along with a demand for reducing production cost of a color filter. A color filter per se comprises a transparent substrate such as a glass plate on which fine stripes of two or more hues are disposed in a parallel or crossing manner or fine pixels are disposed in lateral and longitudinal directions in a predetermined pattern. Each pixel has a fine shape and a dimension of some 10 $\mu$m to some 100 $\mu$m, and the pixels for each hue must be arrayed according to a predetermined order. Thus, a variety of methods for producing a color filter have been proposed. Of these, from many viewpoints, such as the precision of the produced filter and production cost, a pigment-dispersion method employing a photosensitive coloring composition in which a pigment is dispersed has gained wide acceptance.

The pigment-dispersion method comprises applying, on a substrate, a photosensitive coloring composition containing a pigment, a resin serving as a matrix, and a cross-linking agent; and forming each coloring layer in a predetermined pattern through photolithography. More specifically, a color filter is produced through the following steps: applying the aforementioned photosensitive coloring composition for achieving one filter color on a transparent substrate such as a glass plate; exposing patternwise; developing the unexposed portion with a solvent or an aqueous alkaline solution to thereby form a pattern of a first color; and sequentially repeating the procedure for another filter color. A negative-type photosensitive coloring composition is predominantly employed as the above described coloring composition, in view of properties of the produced color filter and a wide range of usable materials. Currently, during development, a solvent is used very seldom, from the viewpoints of environmental problems; instead, an aqueous alkaline solution is predominantly used. Exposure is typically carried out by use of UV light. In the above production steps, only a predetermined portion is irradiated with light such as UV light, to thereby cause a chemical reaction; i.e., radical polymerization, exclusively in the exposed portion.

Since a negative-type photosensitive composition predominantly undergoes radical polymerization, the sensitivity of the composition may be reduced through inhibition of polymerization caused by oxygen in the air. In order to solve this problem, for example, the applied photosensitive composition is irradiated with light after an oxygen-shielding film such as a poly(vinyl alcohol) film is formed on the composition. However, recently, demand has arisen for a photopolymerization initiator for producing a color filter, where the initiator has such high sensitivity that additional treatment such as the provision of an oxygen-shielding film can be eliminated.

In this connection, Japanese Patent Application (kokai) No. 6-201913 discloses a photopolymerization initiator comprising solely a triazine compound, and a photopolymerization initiator comprising a triazine compound and an imidazole compound in combination. Japanese Patent Application (kokai) No. 10-253813 discloses a photopolymerization initiator comprising a polyfunctional thiol compound and at least one compound selected from a biimidazole compound, a titanocene compound, a triazine compound, and an oxadiazole compound. Photopolymerizable compositions containing these photopolymerization initiators for achieving red, green, and blue colors have a certain degree of sensitivity. However, a photopolymerizable composition for achieving a black color, particularly a photopolymerizable composition containing a black pigment, has drawbacks, such as a considerable reduction in sensitivity due to a shielding effect of the black pigment during exposure, increase of exposure time, and insufficient curing, even when the composition contains the above-described polymerization initiator.

SUMMARY OF THE INVENTION

The present inventors have found that a photopolymerization initiator comprising a sensitizer (A) which absorbs light having a wavelength of 300–500 nm, an organic boron complex (B), and a thiol-group-containing compound (C) is suitable for producing a color filter, and that the above problems are solved by use of the initiator. The present invention has been accomplished on the basis of this finding.

In view of the foregoing, an object of the present invention is to provide a high-sensitivity photopolymerization initiator for producing a color filter.

Another object of the present invention is to provide a photosensitive coloring composition containing the initiator.

Another object of the present invention is to provide a color filter exhibiting excellent resistance to a variety of phenomena.

Another object of the present invention is to provide a method for producing the color filter.

Accordingly, the present invention provides a photopolymerization initiator for producing a color filter comprising a sensitizer (A) which absorbs light having a wavelength of 300 to 500 nm; an organic boron complex (B) represented by formula (1):

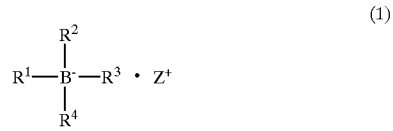

wherein each of $R^1$, $R^2$, $R^3$, and $R^4$ represents an alkyl group, an aryl group, an aralkyl group, an alkenyl group, a heterocyclic group, or an alicyclic group; and Z⁺ represents an ammonium cation, a sulfonium cation, an oxosulfonium cation, a pyridinium cation, a phosphonium cation, an oxonium cation, or an iodonium cation; and a thiol-group-containing compound (C).

Preferably, the thiol-group-containing compound (C) is at least one species selected from 2-mercaptobenzothiazole, trimethylolpropane tris(2-mercaptoacetate), trimethylolpropane tris(3-mercaptopropionate), pentaerythritol tetrakis(2-mercaptoacetate), and pentaerythritol tetrakis(3-mercaptopropionate).

Preferably, the sensitizer (A) contains a benzophenone compound and/or a biimidazole compound.

The present invention also provides a photosensitive coloring composition for producing a color filter, which comprises a transparent polymer (D) soluble in a solvent or an aqueous alkaline solution, a compound having an ethylenic unsaturated bond (E), a pigment (F), and the above-described photopolymerization initiator.

The present invention also provides a color filter having pixels fon-ned on a transparent substrate by use of the photosensitive coloring composition.

The present invention also provides a method for producing a color filter comprising forming a layer of the photosensitive coloring composition on a transparent substrate and photocuring exposed portions of the layer of the composition through exposure.

DESCRIPTION OF THE PREFERRED EMBODIMENTS

The present invention will next be described in more detail. When $R^1$, $R^2$, $R^3$, and $R^4$ in formula (1) represent alkyl groups, and the alkyl groups may have substituents. Specifically, a $C_1$–$C_{12}$ linear or branched alkyl group which may have a substituent is preferred. Examples of suitable alkyl groups include a methyl group, an ethyl group, an n-propyl group, an isopropyl group, an n-butyl group, an isobutyl group, a sec-butyl group, a tert-butyl group, an n-pentyl group, an n-hexyl group, an n-octyl group, a dodecyl group, a cyanomethyl group, a 4-chlorobutyl group, a 2-diethylaminoethyl group, and a 2-methoxyethyl group.

When $R^1$, $R^2$, $R^3$, and $R^4$ in formula (1) represent aryl groups, the aryl groups may have substituents. Specifically, the groups are aryl groups which may be substituted. Examples of suitable aryl groups include a phenyl group, a tolyl group, a xylyl group, a mesityl group, a 4-methoxyphenyl group, a 2-methoxyphenyl group, a 4-n-butylphenyl group, a 4-tert-butylphenyl group, a naphthyl group, a 4-methylnaphthyl group, a 4-ethylnaphthyl group, an anthryl group, a phenanthryl group, a 4-nitrophenyl group, a 4-trifluoromethylphenyl group, a 4-fluorophenyl group, a 4-chlorophenyl group, and a 4-dimethylaminophenyl group.

When $R^1$, $R^2$, $R^3$, and $R^4$ in formula (1) represent aralkyl groups, the aralkyl groups may have substituents. Specifically, the groups are aralkyl groups which may be substituted. Examples of suitable aralkyl groups include a benzyl group, a phenethyl group, a 1-naphthylmethyl group, a 2-naphthylmethyl group, and a 4-methoxybenzyl group.

When $R^1$, $R^2$, $R^3$, and $R^4$ in formula (1) represent alkenyl groups, the alkenyl groups may have substituents. Specifically, the groups are alkenyl groups which may be substituted. Examples of suitable alkenyl groups include a vinyl group, a propenyl group, a butenyl group, and an octenyl group.

When $R^1$, $R^2$, $R^2$, and $R^4$ in lormula (1) represent heterocyclic groups, the heterocyclic groups may have substituents. Specifically, the groups are heterocyclic groups which may be substituted. Examples of such heterocyclic groups include a pyridyl group, a 4-niethylpyridyl group, a quinolyl group, and an indolyl group.

When $R^1$, $R^2$, $R^3$, and $R^4$ in formula (1) represent alicyclic groups, the alicyclic groups may have substituents. Specifically, the groups are alicyclic groups which may be substituted. Examples of such alicyclic groups include a cyclohexyl group, a 4-methylcyclohexyl group, a cyclopentyl group, and a cycloheptyl group.

When $Z^+$ in formula (1) represents an ammonium cation, examples thereof include a tetramethylammonium cation, a tetraethylammonium cation, a tetra-n-propylammonium cation, a tetra-n-butylammonium cation, an n-butyltriphenylammonium cation, a tetraphenylammonium cation, and a benzyltri-phenylammonium cation.

When $Z^+$ in formula (1) represents a sulfonium cation, examples thereof include a triphenylsulfonium cation, a tri(4-tolyl)sulfonium cation, and a 4-tert-butylphenyldiphenylsulfonium cation.

When $Z^+$ in formula (1) represents an oxosulfonium cation, examples thereof include a triphenyloxosulfonium cation, a tri(4-tolyl)oxosulfonium cation, and a 4-tert-butylphenyldiphenyloxosulfonium cation.

When $Z^+$ in formula (1) represents an oxonium cation, examples thereof include a triphenyloxonium cation, a tri(4-tolyl)oxonium cation, and a 4-tert-butylphenyldiphenyloxonium cation.

When $Z^+$ in formula (1) represents a pyridinium cation, examples thereof include an N-methylpyridinium cation and an N-n-butylpyridinium cation.

When $Z^+$ in formula (1) represents a phosphonium cation, examples thereof include a tetramethylphosphonium cation, a tetra-n-butylphosphonium cation, a tetra-n-octylphosphonium cation, a tetraphenylphosphonium cation, and a benzyltriphenylphosphonium cation.

When $Z^+$ in formula (1) represents an iodonium cation, examples thereof include a diphenyliodonium cation, a di(4-methylphenyl)iodonium cation, and a di(4-tert-butylphenyl)iodonium cation.

Examples of organic boron complexes represented by formula (1) include tetramethylammoniurm n-butyltriphenylborate, tetraethylammonium isobutyltriphenylborate, tetra-n-butylammonium methyltriphenylborate, tetra-n-butylammonium n-butyltriphenylborate, tetra-n-butylammonium n-octyltriphenylborate, tetra-n-butylamrnmonium n-butyltri(4-tert-butyl-phenyl)borate, tetra-n-butylammonium methyltrinaphthylborate, tetra-n-butylammonium n-butyltrinaphthylborate, tetra-n-butylammonium n-octyltrinaphthylborate, tetra-ti-butylammonium methyltri(4-methylnaphthyl)borate, tetra-n-butyl-ammonium n-butyltri(4-methylnaphthyl)borate, tetra-n-butylammonium n-octyltri(4-methylnaphthyl)borate, triphenylsulfonium n-butyltriphenylborate, triphenyl-sulfonium n-butyltrinaphthylborate, triphenyloxosulfonium n-butyltriphenylborate, triphenyloxosulfonium n-butyltrinaphthylborate, triphenyloxonium n-butyltriphenylborate, N-methylpyridinium n-butyltriphenylborate, tetraphenyl-phosphonium n-butyltriphenylborate, and diphenyliodonium n-butyltriphenylborate.

In general, the organic boron complex represented by formula (1) absorbs substantially no light having a wavelength of 300 nm or longer. Thus, when the complex is used alone, it is not sensitive to light from a typical UV lamp. However, the combination of the complex and a sensitizer has remarkably high sensitivity.

In the present invention, the organic boron complex (B) is incorporated typically in an amount of 1 to 60 wt. % based on the compound having ethylenic unsaturated bonds, preferably 5 to 30 wt. %. When the amount of the organic boron complex is insufficient, polymerization proceeds insufficiently, whereas when the amount is present in excess, the stability of the composition may decrease, to thereby cause an economically disadvantageous situation.

Examples of the sensitizer (A) which absorbs light having a wavelength of 300 to 500 nm used in the invention include a photopolymerization initiator, a sensitizer, and a dye absorbing light having a wavelength in the range. Examples of the sensitizers include cationic dyes; benzophenones; acetophenones; benzoins; thioxanthones; imidazoles; biimidazoles; coumarins; ketocoumarins; triphenylpyryliums; triazines; benzoic acids; and maleimides. In addition, acylphosphine oxide, methyl phenyl glyoxylate, an α-acyloxime ester, benzil, camphorquinone, and ethylanthraquinone may also be employed. These compounds may be used alone or as a combination of two or more thereof.

Specific examples of the sensitizers include cationic dyes such as Basic Yellow 1, 11, 13, 21, 28, 29, 36, 51 and 63, Basic Orange 21 and 22, benzophenone, 4-methylbenzophenone, 4-fluorobenzophenone, 4-chlorobenzophenone, 4-bromobenzophenone, 4-morpholinobenzophenone, 4-dimethylaminobenzophenone, 4,4'-bis(dimethylamino) benzophenone, 4,4'-bis(diethylamino)benzophenone, 4-dimethylaminoacetophenone, 4-diethylaminoacetophenone, 2-hydroxy-2-phenylacetophenone, 2,4-diethylthioxanthone, 2-methylthioxanthone, N-methylimidazole, N-phenylimidazole, 2,2'-bis(2-chlorophenyl)-4,4',5,5'-tetraphenyl- 1,2'-biimidazole (hereinafter referred to as HIABI), 2,2'-bis(2-chlorophenyl)-4,4', 5,5'-tetra (ethoxyphenyl)- 1,2'-biimidazole, 2,2'-bis(2-chlorophenyl)-4,4',5,5 '-tetra(4-bromophenyl)-1,2'-biimidazole, 2,2'-bis(2, 4-dichlorophenyl)-4,4',5,5'-tetraphenyl-1,2'-biimidazole, 2,2'-bis(2-chlorophenyl)-4,4',5,5'-tetra(3-methoxyphenyl)-1,2'-biimidazole, 2,2'-bis(2-methylphenyl)-4,4',5,5'-tetraphenyl-1,2'-biimidazole, coumarin, 7-diethylaminocoumarin, ethyl 4-dimethylaminobenzoate, N-methylmaleimide, and N-phenylmaleimide. These compounds may be used alone or as a combination of two or more thereof. Considering stability of the initiator and a composition and ability to initiate polymerization, benzophenone compounds, benzoic acids, and biimidazole compounds are preferably used.

In the present invention, the sensitizer (A) which absorbs light having a wavelength of 300 to 500 nm is incorporated typically in an amount of 1 to 60 wt. % based on the compound having ethylenic unsaturated bonds, preferably 2 to 30 wt. %. When the amount is very low, the sensitizing effect may not be obtained, whereas when the amount is present in excess, the sensitizer absorbs light and thus light transmittance efficiency may become poor, and polymerization initiation efficiency may decrease, which is unsatisfactory.

The thiol-group-containing compound (C) used in the present invention is a thiol-group-containing compound in the molecule. Examples of suitable thiol compounds include 2-mercaptobenzothiazole, 2-mercaptobenzimidazole, 2-mercaptobenzoxazole, 5-chloro-2-mercaptobenzothiazole, 2-mercapto-5-methoxybenzothiazole, 5-methyl- 1,3,4-thiadiazole-2-thiol, 5-mercapto-1-methyltetrazole, 3-mercapto-4-methyl-4H-1, 2,4-triazole, 2-mercapto-1-methylimidazole, 2-mercaptothiazoline, octanethiol, hexanedithiol, decanedithiol, 1,4-dimethylmercaptobenzene, butanediol bis(2-mercaptoacetate), butanediol bis(3-mercaptopropionate), ethylene glycol bis(2-mercaptoacetate), ethylene glycol bis(3-mercaptopropionate), trimethylolpropane tris(2-mercaptoacetate), trimethylolpropane tris(3-mercaptopropionate), pentaerythritol tetrakis(2-mercaptoacetate), pentaerythritol tetrakis(3-mercaptopropionate), and trishydroxyethyl tris(3-mercaptopropionate). In considering polymerization initiation ability, particularly, 2-mercaptobenzothiazole, 2-mercaptobenzimidazole, 2-mercaptobenzoxazole, trimethylolpropane tris(2-mercaptoacetate), trimethylolpropane tris(3-mercaptopropionate), pentaerythritol tetrakis(2-mercapto-acetate), and pentaerythritol tetrakis(3-mercaptopropionate) are preferred. These compounds having a thiol group may be used alone or as a combination of two or more thereof.

In the present invention, the thiol-group-containing compound (C) is incorporated typically in an amount of 1 to 60 wt. % based on the compound having ethylenic unsaturated bonds, preferably 5 to 30 wt. %. When the amount is insufficient, polymerization may not be effectively initiated, whereas when the amount is present in excess, the initiation performance may not increase and the addition disadvantageously affects the properties of the cured product.

In the present invention, the combination of the sensitizer (A) which absorbs light having a wavelength of 300 to 500 nm, the organic boron complex (B) represented by formula (1), and the thiol-group-containing compound (C) enhances polymerization performance.

The transparent polymer (D) which is soluble in a solvent or an aqueous alkaline solution used in the present invention is a polymer with high transparency. Accordingly, a film formed of the polymer having a thickness of 1 µm preferably has a percent transmission of 80% or more, more preferably 95% or more within a visible range of 400 to 700 nm, and the polymer can be dissolved in a developer (a solvent or an aqueous alkaline solution). Examples of the polymer include thermosetting resins, thermoplastic resins, and photosensitive resins. These polymers may be used alone or as a combination of two or more thereof. In a post-treatment process for producing a color filter, the polymer is treated at high temperature or with a variety of solvents and chemicals, and therefore, the transparent polymer (D) having excellent heat resistance and resistance to solvents and chemicals is preferably used.

The compound (E) having ethylenic unsaturated bonds used in the present invention may be a compound which can undergo radical polymerization (or cross-linking) and is typically called a monomer or oligomer. Examples of suitable compounds include (meth)acrylic acid; (meth)acrylic acid esters such as methyl (meth)acrylate, butyl (meth) acrylate, benzyl (meth)acrylate, 2-hydroxyethyl (meth) acrylate, and 2-hydroxypropyl (meth)acrylate; ethylene glycol di-(meth)acrylate; pentaerythritol tri(meth)acrylate; styrene; divinylbenzene; (meth)acrylamide; vinyl acetate; N-hydroxymethyl(meth)acrylamide; dipentaerythritol hexaacrylate; melamine acrylate; and an epoxy acrylate pre-polymer. Considering exposure sensitivity and resistance to a variety of phenomena after curing, multifunctional (meth)acrylic monomers are preferably used.

As used herein, the term "(meth)acry" refers to both "methacry" and "acry."

Widely used hues of color filters include additive color mixing types such as red, green, and blue; subtractive color mixing types such as cyan, magenta, and yellow; and black used in a black matrix portion. Coloring agents include dyes and pigments, but pigments are used in the present invention considering heat-resistance and photo-resistance as described above. In order to obtain suitable spectra, two or more pigments are used in combination. For example, a blue spectrum is obtained from the combination of a cyan pigment and a violet pigment; a green spectrum is obtained from the combination of a blue pigment and a yellow pigment; and a red spectrum is obtained from the combination of a red pigment and a yellow or an orange pigment.

Examples of the pigment (F) used in the present invention, represented by color index numbers, include C. I. Pigment Yellow 12, 13, 14, 17, 20, 24, 55, 83, 86, 93, 109, 110, 117, 125, 137, 139, 147, 148, 153, 154, 166, 168, C. I. Pigment Orange 36, 43, 51, 55, 59, 61, C. I. Pigment Red 9, 97, 122, 123, 149, 168, 177, 180, 192, 215, 216, 217, 220, 223, 224, 226, 227, 228, 240, C. I. Pigment Violet 19, 23, 29, 30, 37, 40, 50, C. I. Pigment Blue 15, 15:1, 15:4, 15:6, 22, 60, 64, C. I. Pigment Green 7, 36, C. I. Pigment Brown 23, 25, 26, C. I. Pigment Black 7, and Titanium Black.

In the photosensitive coloring composition of the present invention, the pigment should be sufficiently dispersed. In addition, the photosensitive coloring composition should be applied to a transparent substrate to a thickness of 1 to 3 $\mu$m. Therefore, in order to impart suitable applicability to the composition, in general, the viscosity of the composition is controlled by use of a solvent. Examples of suitable solvents include methanol, ethanol, toluene, cyclohexane, isophorone, cellosolve acetate, diethylene glycol dimethyl ether, ethylene glycol diethyl ether, xylene, ethylbenzene, methyl cellosolve, ethyl cellosolve, butyl cellosolve, propylene glycol monomethyl ether, isoamyl acetate, ethyl lactate, methyl ethyl ketone, acetone, and cyclohexanone. These solvents may be used alone or as a combination of two or more thereof.

The photosensitive coloring composition is produced by use of any of a variety of means for dispersion, such as a three-roll mill, a two-roll mill, a sand mill, an attrition mill, a ball mill, a kneader, and a paint shaker. In order to prevent gelation attributed to polymerization during the dispersion process, a polymerization inhibitor may be added, and a monomer and the photopolymerization initiator may be added after dispersion of the pigment. Furthermore, in order to facilitate the dispersion of the pigment, an appropriate dispersing aid may be added. Since a dispersing aid facilitates dispersion and prevents re-aggregation of the pigment, a color filter of excellent transparency can be produced.

In general, the color filter of the present invention is produced by applying the photosensitive coloring composition of the present invention to a transparent substrate such as a glass substrate, and photocuring the composition through exposure. In general, the color filter is produced by the following steps:

in a first step, a photosensitive color resin layer is formed on a transparent substrate;

in a second step, the photosensitive resin layer is exposed patternwise via a pattern mask having a specific pattern;

in a third step, the photosensitive color resin layer is developed after completion of patternwise exposure, to thereby retain the patterned photosensitive resin layer serving as a pixel layer on the transparent substrate; and in a fourth step, the transparent substrate on which a pixel layer is formed is baked (post-baked) after completion of development. A method for producing the color filter of the present invention is not limited to the above-described method so long as the photosensitive coloring composition of the present invention is used.

Preferred steps for producing a color filter in the present invention will next be described in detail.

In the first step, the photosensitive coloring composition is applied to a transparent substrate such as a glass substrate through a coating method such as spray-coating, spin-coating, roll-coating, or screen-coating. In order to impart suitable fluidity to such a coating apparatus, the photosensitive coloring composition may contain, in addition to the aforementioned solvents, extender pigments such as barium sulfate, calcium carbonate, and silica; and a small amount of silicon-type or fluorine-type surfactants serving as leveling agents or defoaming agents. The applied photosensitive coloring composition may be dried (pre-baked) typically at 30 to 100° C. for 10 to 30 minutes so as to remove solvent by use of a blower-equipped oven or a hot plate. When the temperature is very high or the drying time is very long, partial polymerization or cross-linking may occur and the solubility of unexposed portions to a developer may decrease, which disadvantageously causes poor development.

In the second step, the photosensitive resin layer obtained in the first step is irradiated with a UV beam via a photomask typically having a color filter pattern. A light source such as an ultra-high-pressure Hg lamp or a metal halide lamp is typically employed. Since UV light passing through the photomask typically has a wavelength of 300 nm or more, three types of rays included in the bright line spectrum of the ultra-high-pressure Hg lamp; i.e., i-ray (365 nm), h-ray (405 nm), and g-ray (436 nm), are used for polymerization or cross-linking. Therefore, sensitivity to the above three spectral lines is important when the photosensitive coloring composition is used in forming a color filter.

In the third step, the exposed photosensitive resin layer obtained in the second step is developed with a weak alkaline developer; i.e., the unexposed (uncured) portion of the photosensitive resin layer is removed so as to provide a pixel layer.

In the fourth step, the pixel-layer-formned transparent substrate obtained in the third step is post-baked at 160 to 300° C. for about 20 to 60 minutes, to thereby obtain a pixel layer of a first color.

Beyond the first color, color filters of a variety of colors are produced by repeating the above four steps.

EXAMPLES

The present invention will next be described by way of examples. In the examples, the term "parts" refers to "parts by weight," and "%" refers to "wt. %." In addition, the prepared photosensitive coloring composition will be referred to as "resist" for convenience of description. In the examples, a alkali-development-type black resist produced by means of a pigment dispersion method, which is widely employed as a method for producing a color filter for a color liquid crystal display at the present time, will be described. Prior to the examples, an example synthesis of an aqueous alkaline solution-soluble resin will be described.

Production Example of Resin Solution 1

Cyclohexanone (350 parts), styrene (26 parts), 2-hydroxyethyl acrylate (23 parts), methacrylic acid (35 parts), methyl methacrylate (21 parts), and butyl methacrylate (70 parts) were charged into a 1-liter four-neck flask and heated to 90° C. Independently, cyclohexanone (290 parts), styrene (26 parts), 2-hydroxyethyl acrylate (23 parts), methacrylic acid (35 parts), methyl methacrylate (21 parts), butyl methacrylate (70 parts), and azobisisobutyronitrile (1.75 parts) were mixed to prepare a solution. The thus-prepared solution was added dropwise to the above reaction mixture over a three-hour period. The resultant mixture was further allowed to react for three hours at 90° C. Subsequently, a solution of azobisisobutyronitrile (0.75 parts) in cyclohexanone (10 parts) was further added thereto, and the mixture was allowed to react for one hour, to thereby synthesize a resin solution. A portion of the solution was sampled and heated at 180° C. for 20 minutes for drying, to thereby quantitatively determine non-volatile component content. Based on the measurement, cyclohexanone was added to the synthesized resin solution so as to adjust the content of non-volatile component to 20%. Thus, Resin Solution 1 was prepared.

Production Example of Resin Solution 2

Cyclohexanone (350 parts), styrene (26 parts), 2-hydroxyethyl acrylate (44 parts), acrylic acid (35 parts), and butyl methacrylate (70 parts) were charged into a 1-liter four-neck flask and heated to 90° C. Independently, cyclohexanone (290 parts), styrene (26 parts), 2-hydroxyethyl acrylate (44 parts), acrylic acid (35 parts), butyl methacrylate (70 parts), and azobisisobutyronitrile (1.75 parts) were mixed to prepare a solution. The thus-prepared solution was added dropwise to the above reaction mixture over a three-hour period. The resultant mixture was further allowed to react for three hours at 90° C. Subsequently, a solution of azobisisobutyronitrile (0.75 parts) in cyclohexanone (10 parts) was further added thereto, and the mixture was allowed to react for one hour, to thereby synthesize a resin solution. Thereafter, the temperature in the flask was cooled to 80° C., and a solution of isocyanate ethyl methacrylate (24 parts) and tin octylate (0.11 parts) in cyclohexanone (20 parts) was further added dropwise thereto over 10 minutes, and the mixture was allowed to react for 20 minutes, to thereby synthesize a resin solution. In the same manner as for Resin Solution 1, cyclohexanone was added to the synthesized resin solution, to thereby prepare Resin Solution 2 having a non-volatile component content of 20%.

Examples 1 to 20

Preparation of a black resist
Resin Solution 1:55 parts
Special Black (product of Degussa): 5.7 parts
Dispersing agent: 0.29 parts
Cyclohexanone: 7.8 parts The above components were mixed, and dispersed by use of a paint shaker for 24 hours, to thereby prepare a black dispersion. Next, the following components:

Black dispersion: 54.15 parts
NK Ester ATMPT (product of Shin-Nakamura Chemical Co.,Ltd.): 4.85 parts
Sensitizer: 0.7–1.8 parts
Organic boron complex: 0.9 parts
Thiol compound: 0.9 parts
Cyclohexanone: 39.0 parts were sufficiently mixed in a vessel, and the resultant mixture was filtered through a 1.0 μm filter, to thereby prepare a black resist having a non-volatile component content of about 20%.

Combinations of the sensitizer, organic boron complex, and thiol compound and the proportions of components in the sensitizer are shown in Tables 1-a through 1-d below.

TABLE 1-a

| Ex. | Sensitizer (0.7–1.8 parts) | Organic Boron Complex (0.9 parts) | Thiol Compound (0.9 parts) |
| --- | --- | --- | --- |
| Ex. 1 | Basic Yellow 21 (0.3 parts) Ethyl Michler's ketone (0.4 parts) HABI (1.0 part) | Tetrabutylammonium butyltriphenylborate | 2-Mercapto-benzothiazole |
| Ex. 2 | Basic Yellow 21 (0.3 parts) Ethyl Michler's ketone (0.4 parts) HABI (1.0 part) | Tetrabutylammonium butyltri(4-methylnaphthyl)borate | 2-Mercapto-benzothiazole |
| Ex. 3 | Basic Yellow 21 (0.3 parts) Ethyl Michler's ketone (0.4 parts) HABI (1.0 part) | Tetrabutylammonium methyltri(4-methyl-naphthyl)borate | 2-Mercapto-benzothiazole |
| Ex. 4 | Basic Yellow 21 (0.3 parts) Ethyl Michler's ketone (0.4 parts) HABI (1.0 part) | Tetrabutylammonium methyltri(4-methyl-naphthyl)borate | Penta-erythritol tetrakis(3-mercapto-propionate) |
| Ex. 5 | Basic Yellow 21 (0.3 parts) HABI (1.0 part) | Tetrabutylammonium methyltri(4-methyl-naphthyl)borate | 2-Mercapto-benzothiazole |

TABLE 1-b

| Ex. | Sensitizer (0.7–1.8 parts) | Organic Boron Complex (0.9 parts) | Thiol Compound (0.9 parts) |
| --- | --- | --- | --- |
| Ex. 6 | Ethyl Michler's ketone (0.3 parts) HABI (1.0 part) | Tetrabutylammonium methyltri(4-methyl-naphthyl)borate | 2-Mercapto-benzothiazole |
| Ex. 7 | Basic Yellow 21 (0.3 parts) Ethyl Michler's ketone (0.4 parts) HABI (1.0 part) | Tetrabutylammonium methyltri(4-methyl-naphthyl)borate | 2-Mercapto-thiazoline |
| Ex. 8 | Basic Yellow 13 (0.3 parts) Ethyl Michler's ketone (0.4 parts) HABI (1.0 part) | Tetrabutylammonium methyltri(4-methyl-naphthyl)borate | 2-Mercapto-benzothiazole |
| Ex. 9 | Basic Yellow 21 (0.3 parts) Ethyl Michler's ketone (0.3 parts) Benzophenone (0.2 parts) HABI (1.0 part) | Tetrabutylammonium methyltri(4-methyl-naphthyl)borate | 2-Mercapto-benzothiazole |
| Ex. 10 | Basic Yellow 21 (0.3 parts) Ethyl 4-dimethylamino-benzoate (0.3 parts) HABI (1.0 part) | Tetrabutylammonium methyltri(4-methyl-naphthyl)borate | 2-Mercapto-benzothiazole |

TABLE 1-c

| Ex. | Sensitizer (0.7–1.8 parts) | Organic Boron Complex (0.9 parts) | Thiol Compound (0.9 parts) |
| --- | --- | --- | --- |
| Ex. 11 | Ethyl Michler's ketone (0.3 parts) HABI (1.0 part) | Tetrabutylammonium methyltriphenyl-borate | 2-Mercapto-benzothiazole |
| Ex. 12 | Ethyl Michler's ketone (0.3 parts) HABI (1.0 part) | Tetrabutylammonium methyltriphenyl-borate | 2-Mercapto-benzimidazole |
| Ex. 13 | Ethyl Michler's ketone (0.3 parts) HABI (1.0 part) | Tetrabutylammonium methyltriphenyl-borate | Trimethylol-propane tris(3-mercapto-propionate) |
| Ex. 14 | Ethyl Michler's ketone (0.3 parts) HABI (1.0 part) | Tetrabutylammonium methyltriphenyl-borate | Penta-erythritol tetrakis(3-mercapto-propionate) |
| Ex. 15 | Ethyl Michler's ketone (0.3 parts) HABI (1.0 part) | Tetrabutylammonium methyltrinaphthyl-borate | Trimethylol-propane tris(3-mercapto-propionate) |

TABLE 1-d

| Sensitizer Ex. (0.7–1.8 parts) | Organic Boron Complex (0.9 parts) | Thiol Compound (0.9 parts) |
|---|---|---|
| Ex. 16 | Ethyl Michler's ketone (0.3 parts) HABI (1.0 part) | Tetrabutylammonium methyltri(4-methyl-naphthyl)borate | Trimethylolpropane tris(3-mercaptopropionate) |
| Ex. 17 | Basic Yellow 21 (0.3 parts) HABI (1.0 part) | Tetrabutylammonium methyltri(4-methyl-naphthyl)borate | Trimethylolpropane tris(3-mercaptopropionate) |
| Ex. 18 | Basic Yellow 21 (0.3 parts) Ethyl Michler's ketone (0.3 parts) HABI (1.0 part) | Tetrabutylammonium methyltri(4-methyl-naphthyl)borate | Trimethylolpropane tris(3-mercaptopropionate) |
| Ex. 19 | Ethyl Michler's ketone (0.3 parts) Benzophenone (0.3 parts) HABI (1.0 part) | Tetrabutylammonium methyltri(4-methyl-naphthyl)borate | Trimethylolpropane tris(3-mercaptopropionate) |
| Ex. 20 | Ethyl Michler's ketone (0.3 parts) Ethyl 4-dimethylamino-benzoate (0.3 parts) HABI (1.0 part) | Tetrabutylammonium methyltri(4-methyl-naphthyl)borate | Trimethylolpropane tris(3-mercaptopropionate) |

Comparative Example

The following components:

The above black dispersion: 54.15 parts

NK Ester ATMPT (product of Shin-Nakamura Chemical Co., Ltd.): 4.85 parts 2-(4-Methoxyphenyl)-4,6-bis(trichloromethyl)-s-triazine: 2 parts Cyclohexanone: 39.0 parts were sufficiently mixed in a vessel, and the resultant mixture was filtered through a 1.0 μm filter, to thereby prepare a black resist having a non-volatile component content of about 20%, to serve as a comparative example.

In order to measure the spectral sensitivity of the resists obtained, each resist was applied to a glass plate (100 mm×100 mm) by use of a spin-coater so as to obtain a film having a dry thickness of 1.4 μm, and was dried at 70° C. for 20 minutes in a blower-equipped oven. The resist was irradiated with a beam generated from a spectral irradiator (JASCO Model CT-25CP, product of Nihonbunko). An ultra-high-pressure Hg lamp was used as a light source. After completion of exposure, the substrate was immersed in a 1% aqueous solution of sodium carbonate for approximately 60 seconds for development, washed in a water stream, and heated at 220° C. for 30 minutes, to thereby obtain a spectral photograph. In Table 3, the step tablet numbers at which the cured composition remained after development are shown for the cases of exposure to i-ray (365 nm), h-ray (405 nm), and g-ray (436 nm), respectively. The relationship between the step and light intensity is shown in the following Table 2. Briefly, the greater the number of the step, the higher the sensitivity.

TABLE 2

| Step No. (steps) | Light intensity (mJ/cm$^2$) |
|---|---|
| 13 | 1.00 |
| 12 | 1.78 |
| 11 | 3.16 |
| 10 | 5.62 |
| 9 | 10.0 |
| 8 | 17.8 |

TABLE 2-continued

| Step No. (steps) | Light intensity (mJ/cm$^2$) |
|---|---|
| 7 | 31.6 |
| 6 | 56.2 |
| 5 | 100 |
| 4 | 178 |
| 3 | 316 |
| 2 | 562 |
| 1 | 1000 |

The results are shown in Table 3.

TABLE 3

| Example No. | i-ray | h-ray | g-ray |
|---|---|---|---|
| Example 1 | 3 | 3 | 3 |
| Example 2 | 5 | 4 | 4 |
| Example 3 | 6 | 6 | 5 |
| Example 4 | 10 | 8 | 7 |
| Example 5 | 3 | 6 | 5 |
| Example 6 | 2 | 4 | 4 |
| Example 7 | 6 | 6 | 5 |
| Example 8 | 6 | 5 | 5 |
| Example 9 | 7 | 6 | 5 |
| Example 10 | 6 | 6 | 5 |
| Example 11 | 5 | 4 | 0 |
| Example 12 | 5 | 4 | 0 |
| Example 13 | 8 | 7 | 1 |
| Example 14 | 8 | 7 | 1 |
| Example 15 | 9 | 8 | 2 |
| Example 16 | 12 | 9 | 2 |
| Example 17 | 6 | 9 | 8 |
| Example 18 | 12 | 9 | 8 |
| Example 19 | 12 | 10 | 2 |
| Example 20 | 11 | 9 | 2 |
| Comp. Ex. | 3 | 0 | 0 |

As is apparent from the results in Table 3, according to the present invention, a photosensitive coloring composition of high sensitivity can be obtained without formation of an oxygen-shielding film. Therefore, steps in a process for producing a color filter can be reduced, and cost reduction is attained due to enhancement of productivity. In addition, a color filter having excellent resistance can be obtained.

While the invention has been described in detail and with reference to specific embodiments thereof, it will be apparent to one skilled in the art that various changes and modifications can be made therein without departing from the spirit and scope thereof.

What is claimed is:

1. A color filter having pixels formed on a transparent substrate comprising a photosensitive coloring composition comprising a transparent polymer (D) soluble in a solvent or an aqueous alkaline solution, a compound having an ethylenic unsaturated bond (E), a pigment (F), a photopolymerization initiator for producing a color filter, said photopolymerization initiator comprising a sensitizer (A) which absorbs light having a wavelength of 300 to 500 nm, said sensitizer (A) containing a benzophenone compound, a biimidazole compound or a mixture thereof; an organic boron complex (B) represented by formula (1):

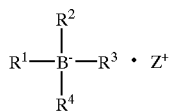

(1)

wherein each of $R^1$, $R^2$, $R^3$, and $R^4$ represents an alkyl group, an aryl group, an aralky group, an alkenyl group, a heterocyclic group, or an alicyclic group; and $Z^+$ represents an ammonium cation, a sulfonium cation, an oxosulfonium cation, a pyridinium cation, a phosphonium cation, an oxonium cation, or an iodonium cation; and a compound (C) containing multiple thiol groups.

2. A color filter according to claim 1, wherein said compound (C) is at least one member selected from the group consisting of butanediol bis(2-mercaptoacetate), butanediol bis (3-mercaptopropionate), ethylene glycol bis(2-mercaptoacetate), ethylene glycol bis(3-mercaptopropionate), trimethylolpropane tris(2-mercaptoacetate), trimethylolpropane tris(3-mercaptopropionate), pentaerythritol tetrakis(2-mercaptoacetate), and pentaerythritol tetrakis(3-mercaptopropionate).

3. A method for producing a color filter comprising forming a layer of a photosensitive coloring composition having an exposed portion on a transparent substrate; said photosensitive coloring composition comprising a transparent polymer (D) soluble in a solvent or an aqueous alkaline solution, a compound having an ethylenic unsaturated bond (E), a pigment (F), a photopolymerization initiator for producing a color filter, said photopolymerization initiator comprising a sensitizer (A) which absorbs light having a wavelength of 300 to 500 nm, said sensitizer (A) containing a benzophenone compound, a biimidazole compound or a mixture thereof; an organic boron complex (B) represented by formula (1):

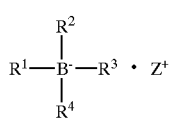

(1)

wherein each of $R^1$, $R^2$, $R^3$, and $R^4$ represents an alkyl group, an aryl group, an aralkyl group, an alkenyl group, a heterocyclic group, or an alicyclic group; and $Z^+$ represents an ammonium cation, a sulfonium cation, an oxosulfonium cation, a pyridinium cation, a phosphonium cation, an oxonium cation, or an iodonium cation; and a compound (C) containing multiple thiol groups, and photocuring the exposed portion.

4. A method for producing a color filter according to claim 3, wherein said compound (C) is at least one member selected from the group consisting of butanediol bis(2-mercaptoacetate), butanediol bis (3-mercaptopropionate), ethylene glycol bis(2-mercaptoacetate), ethylene glycol bis(3-mercaptopropionate), trimethylolpropane tris(2-mercaptoacetate), trimethylolpropane tris(3-mercaptopropionate), pentaerythritol tetrakis(2-mercaptoacetate), and pentaerythritol tetrakis(3-mercaptopropionate).

5. A color filter having pixels formed on a transparent substrate comprising a photosensitive coloring composition comprising a transparent polymer (D) soluble in a solvent or an aqueous alkaline solution, a compound having an ethylenic unsaturated bond (E), a pigment (F), a photopolymerization initiator for producing a color filter, said photopolymerization initiator comprising a sensitizer (A) which absorbs light having a wavelength of 300 to 500 mn, said sensitizer (A) containing a benzophenone compound, a buimidazole compound or a mixture thereof; an organic boron complex (B) represented by formula (1):

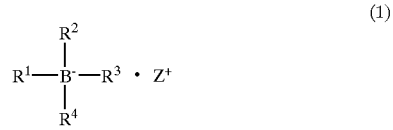

wherein each of $R^1$, $R^2$, $R^3$, and $R^4$ represents an alkyl group, an aryl group, an aralkyl group, an alkenyl group, a heterocyclic group, or an alicyclic group; and $Z$, represents an ammonium cation, a sulfonium cation, an oxosulfonium cation, a pyridinium cation, a phosphonium cation, an oxonium cation, or an iodonium cation; and a compound (C) containing a thiol group.

6. A method for producing a color filter comprising forming a layer of a photosensitive coloring composition having an exposed portion on a transparent substrate; said photosensitive coloring composition comprising a transparent polymer (D) soluble in a solvent or an aqueous alkaline solution, a compound having an ethylenic unsaturated bond (E), a pigment (F), a photopolymerization initiator for producing a color filter, said photopolymerization initiator comprising a sensitizer (A) which absorbs light having a wavelength of 300 to 500 nm, said sensitizer (A) containing a benzophenone compound, a biimidazole compound or a mixture thereof; an organic boron complex (B) represented by formula (1):

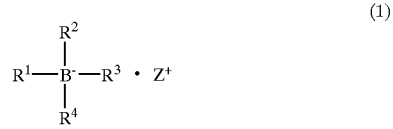

wherein each of $R^1$, $R^2$, $R^3$, and $R^4$ represents an alkyl group, an aryl group, an aralkyl group, an alkenyl group, a heterocyclic group, or an alicyclic group; and $Z^+$ represents an ammonium cation, a sulfonium cation, an oxosulfonium cation, a pyridinium cation, a phosphonium cation, an oxonium cation, or an iodonium cation; and a compound (C) containing a thiol group, and photocuring the exposed portion.

7. A color filter having pixels formed on a transparent substrate comprising a photosensitive coloring composition comprising a transparent polymer (D) soluble in a solvent or an aqueous alkaline solution, a compound having an ethylenic unsaturated bond (E), a pigment (F),
a photopolymerization initiator for producing a color filter, said photopolymerization initiator comprising a sensitizer (A) which absorbs light having a wavelength of 300 to 500 nm, said sensitizer (A) containing a benzophenone compound, a bilmidazole compound or a mixture thereof; an organic boron complex (B) represented by formula (1):

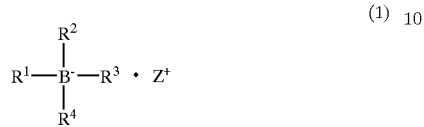

(1)

wherein each of $R^1$, $R^2$, $R^3$, and $R^4$ represents an alkyl group, an aryl group, an aralkyl group, an alkenyl group, a heterocyclic group, or an alicyclic group; and $Z^+$ represents an ammonium cation, a sulfonium cation, an oxosulfonium cation, a pyridinium cation, a phosphonium cation, an oxonium cation, or an iodonium cation; and a compound (C) containing a thiol group, wherein said thiol-group-containing compound (C) is
at least one member selected from the group consisting of 2-mercaptobenzothiazole, butanediol bis(2-mercaptoacetate), butanediol bis(3-mercaptopropionate), ethylene glycol bis(2-mercaptoacetate), ethylene glycol bis(3-mercaptopropionate), trimethylolpropane tris(2-mercaptoacetate), trimethylolpropane tris(3-mercaptopropionate), pentaerythritol tetrakis(2-mercaptoacetate), and pentaerythritol tetrakis(3-mercaptopropionate).

8. A method for producing a color filter comprising
forming a layer of a photosensitive coloring composition having an exposed portion on a transparent substrate; said photosensitive coloring composition comprising
a transparent polymer (D) soluble in a solvent or an aqueous alkaline solution,
a compound having an ethylenic unsaturated bond (E),
a pigment (F),
a photopolymerization initiator for producing a color filter, said photopolymerization initiator comprising a sensitizer (A) which absorbs light having a wavelength of 300 to 500 nm, said sensitizer (A) containing a benzophenone compound, a biimidazole compound or a mixture thereof; an organic boron complex (B) represented by formula (1):

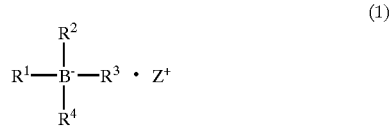

(1)

wherein each of $R^1$, $R^2$, $R^3$, and $R^4$ represents an alkyl group, an aryl group, an aralkyl group, an alkenyl group, a heterocyclic group, or an alicyclic group; and $Z^+$ represents an ammonium cation, a sulfonium cation, an oxosulfonium cation, a pyridinium cation, a phosphonium cation, an oxonium cation, or an iodonium cation; and a compound (C) containing a thiol group, wherein said thiol-group-containing compound (C) is
at least one member selected from the group consisting of 2-mercaptobenzothiazole, butanediol bis(2-mercaptoacetate), butanediol bis(3-mercaptopropionate), ethylene glycol bis(2-mercaptoacetate), ethylene glycol bis(3-mercaptopropionate), trimethylolpropane tris(2-mercaptoacetate), trimethylolpropane tris(3-mercaptopropionate), pentaerythritol tetrakis(2-mercaptoacetate), and pentaerythritol tetrakis(3-mercaptopropionate),
and photocuring the exposed portion.

\* \* \* \* \*